United States Patent [19]
Van Hunsel

[11] Patent Number: 5,635,318
[45] Date of Patent: Jun. 3, 1997

[54] METHOD FOR MAKING A LITHOGRAPHIC PRINTING PLATE WITH FREQUENCY MODULATED HALFTONE DOTS

[75] Inventor: Johan Van Hunsel, Berchem, Belgium

[73] Assignee: AGFA-Gevaert, N.V., Mortsel, Belgium

[21] Appl. No.: 542,919

[22] Filed: Oct. 13, 1995

[30] Foreign Application Priority Data

Dec. 12, 1994 [EP] European Pat. Off. .............. 94203587

[51] Int. Cl.⁶ .............................. G03C 8/28; G03C 8/06; G03C 5/08; G03F 7/07
[52] U.S. Cl. ...................... 430/11; 430/204; 430/30; 430/244; 430/494; 358/480; 358/481; 358/486
[58] Field of Search .................... 430/204, 30, 244, 430/11, 494, 397, 395; 358/480, 481, 486

[56] References Cited

U.S. PATENT DOCUMENTS 5,196,290  3/1993  Coppens et al. ..................... 430/204

*Primary Examiner*—Richard L. Schilling
*Attorney, Agent, or Firm*—Breiner & Breiner

[57] ABSTRACT

There is provided a method for making a lithographic printing plate according to the DTR-process from a printing plate precursor comprising on a hydrophilic surface of a support in the order given a layer of physical development nuclei and a silver halide emulsion layer from an original containing continuous tones comprising the steps of:

frequency modulation screening said original to obtain screened data, image-wise exposing said printing plate precursor according to said screened data, developing a thus obtained image-wise exposed lithographic printing plate precursor by means of an alkaline processing solution in the presence of a developing agent and a silver halide solvent yielding a lithographic printing plate, characterized in that the frequency modulated halftone dot with the greatest main dimension on said lithographic printing plate has a main dimension of more than 21 μm.

10 Claims, 1 Drawing Sheet

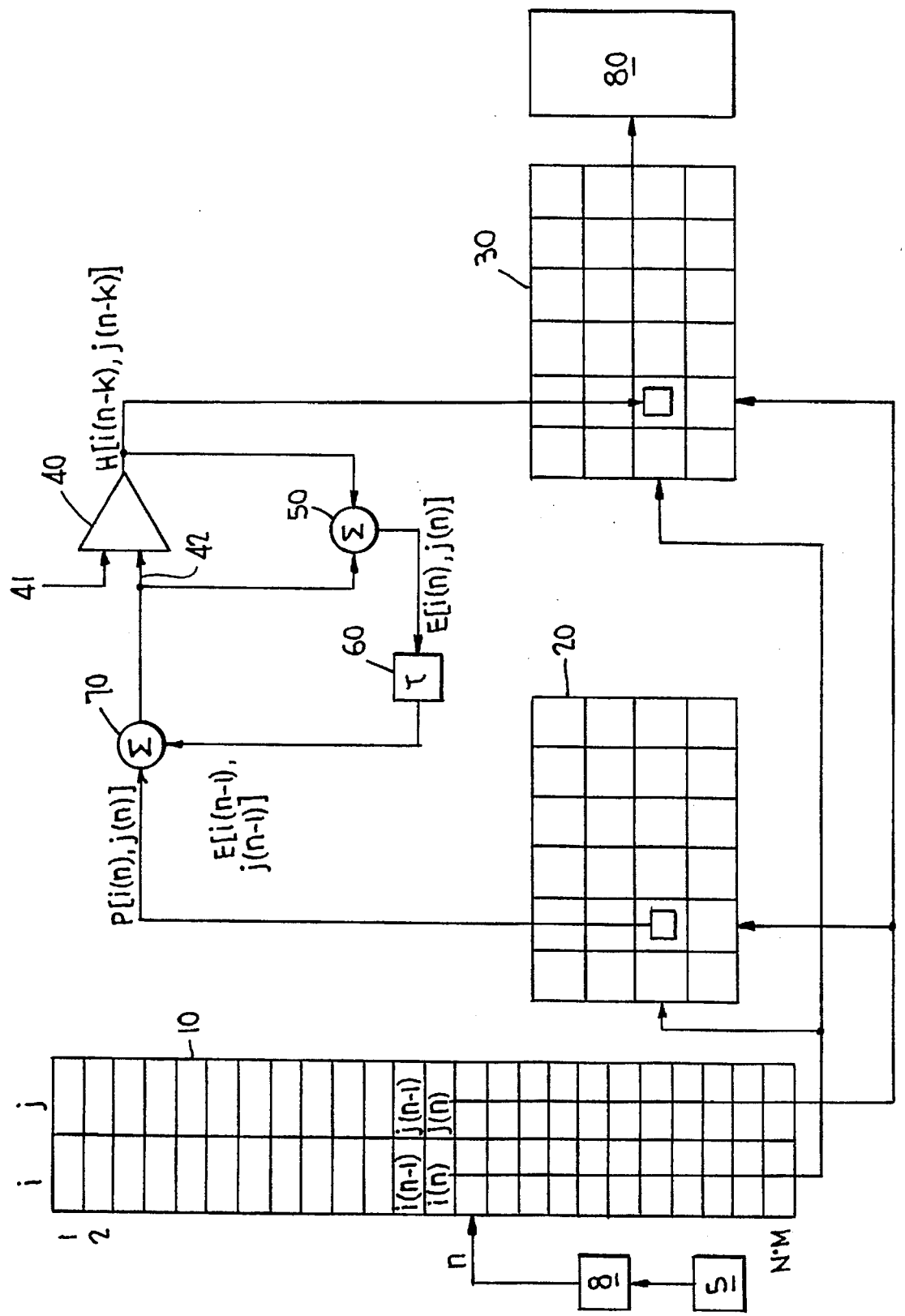

METHOD FOR MAKING A LITHOGRAPHIC PRINTING PLATE WITH FREQUENCY MODULATED HALFTONE DOTS

FIELD OF THE INVENTION

The present invention relates to a method for making a lithographic printing plate according to the silver salt diffusion transfer process comprising a frequency modulation screening of the original.

BACKGROUND OF THE INVENTION

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde—The Focal Press London—and New York, (1972).

In the DTR-process non-developed silver halide of an information-wise exposed photographic silver halide emulsion layer material is transformed with a so-called silver halide solvent into soluble silver complex compounds which are allowed to diffuse into an image receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellent ink-receptive areas on a water-receptive ink-repellent background.

The DTR-image can be formed in the image receiving layer of a sheet or web material which is a separate element with respect to the photographic silver halide emulsion material (a so-called two-sheet DTR element) or in the image receiving layer of a so-called single-support-element, also called mono-sheet element, which contains at least one photographic silver halide emulsion layer integral with an image receiving layer in waterpermeable relationship therewith. It is the latter mono-sheet version which is preferred for the preparation of offset printing plates by the DTR method.

Two types of the mono-sheet DTR offset printing plate exist. According to a first type disclosed in e.g. U.S. Pat. No. 4,722,535 and GB-1,241,661 a support is provided in the order given with a silver halide emulsion layer and a layer containing physical development nuclei serving as the image-receiving layer. After information-wise exposure and development by means of an alkaline processing solution in the presence of a developing agent and a silver halide solvent the imaged element is used as a printing plate without the removal of the emulsion layer.

According to a second type of mono-sheet DTR offset printing plate a hydrophilic surface of a support is provided in the order given with a layer of physical development nuclei and a silver halide emulsion layer. After information-wise exposure and development by means of an alkaline processing solution in the presence of a developing agent and a silver halide solvent the imaged element is treated to remove the emulsion layer so that a support carrying a silver image is left which is used as a printing plate. Such type of lithographic printing plate is disclosed e.g. in U.S. Pat. No. 3,511,656.

From the above it will be clear that lithographic printing is only capable of reproducing two tone values because the areas will accept ink or not. Thus lithographic printing is a so called binary process. In order to reproduce originals having continuously changing tone values by such process halftone screening techniques are applied.

In a commonly used halftone screening technique, the continuously changing tone values of the original are modulated with periodically changing tone values of a superimposed two-dimensional screen. The modulated tone values are then subject to a thresholding process wherein tone values above the threshold value will be reproduced and those below will not be reproduced. The process of tone-value modulation and thresholding results in a two-dimensional arrangement of equally spaced "screen dots" whose dimensions are proportional to the tone value of the original at that particular location. The number of screen dots per unit distance determines the screen frequency or screen ruling. This screening technique wherein the screen frequency is constant and inversely proportional to the halftone cell size, is referred to as amplitude-modulation screening or autotypical screening. This technique can be implemented photo-mechanically or electronically.

It will further be clear that in order to reproduce a color image using lithographic printing it will be required to separate the image in three or more part-images corresponding to primary colors that when printed over each other yield the desired color at any place within the image. Each of these color separations has to be screened as described above.

It is well known that the above described procedure of screening results in certain artifacts on a copy obtained in lithographic printing. Such artifacts are e.g. enlarging of the screen dots on the press, Moire patterns, color shifts, etc.

A lot of variants of the dot size modulation screening have been disclosed in order to remedy these artifacts but none of them was capable of completely eliminating the enlarging of the screen dots on the press and the Moirépatterns and dot frequency modulation screening techniques have therefore been suggested to further reduce the problem.

According to frequency modulation screening the distance between the halftone dots is modulated rather then their size. This technique, although well known in the field of low resolution plain paper printers, has only recently obtained much attention for offset printing and other high end printing methods.

Methods for making a lithographic printing plate according to the silver salt diffusion transfer process comprising the steps of frequency modulation screening an original to obtain screened data and image-wise exposing an imaging element according to said screened data, said exposure being scan-wise and/or said imaging element having a flexible support and/or a photosensitive layer comprising a direct positive silver halide emulsion have been disclosed in e.g. EP-A 620673, EP-A 620674 and EP-A 94201942.3.

When a mono-sheet DTR offset printing plate of the second type is prepared comprising the steps of frequency modulation screening an original to obtain screened data and image-wise exposing a precursor of a mono-sheet DTR offset printing plate of the second type according to said screened data and developing a thus obtained image-wise exposed lithographic printing plate precursor by means of an alkaline processing solution in the presence of a developing agent and a silver halide solvent, this printing plate has a constrained tone range in print, a restricted development latitude and a marked loss of the tone value over the whole tone scale but especially in the lower range of said scale in function of the number of printed copies when said imaging elements does not comprise halftone dots of more than 21 µm.

SUMMARY OF INVENTION

It is an object of the present invention to provide a method for making a lithographic printing plate according to the DTR-process from a printing plate precursor comprising on a hydrophilic surface of a support in the order given a layer of physical development nuclei and a silver halide emulsion layer by means of frequency modulation screening an original to obtain screened data with improved printing properties e.g. an extended tone scale in print, a larger development latitude and a smaller loss of the tone value over the whole tone scale but especially in the lower range of said scale in function of the number of printed copies.

Further objects of the present invention will become clear from the description hereinafter.

According to the present invention there is provided a method for making a lithographic printing plate according to the DTR-process from a printing plate precursor comprising on a hydrophilic surface of a support in the order given a layer of physical development nuclei and a silver halide emulsion layer from an original containing continuous tones comprising the steps of:

frequency modulation screening said original to obtain screened data, image-wise exposing said printing plate precursor according to said screened data.

developing a thus obtained image-wise exposed lithographic printing plate precursor by means of an alkaline processing solution in the presence of a developing agent and a silver halide solvent yielding a lithographic printing plate, characterized in that the frequency modulated halftone dot with the greatest main dimension on said lithographic printing plate has a main dimension of more than 21 µm.

BRIEF DESCRIPTION OF THE DRAWINGS

The present invention is illustrated by way of example and without the intention to limit the invention thereto by means of the following drawing:

The sole FIGURE shows a schematic representation of a circuit for implementing a halftoning method suitable for use in the present invention.

DETAILED DESCRIPTION OF THE INVENTION

Surprisingly, it was found that when a lithographic printing plate is prepared according to the DTR-process from a printing plate precursor comprising on a hydrophilic surface of a support in the order given a layer of physical development nuclei and a silver halide emulsion layer by means of frequency modulation screening an original to obtain screened data, this printing plate has improved printing properties e.g. an extended tone range in print, a larger development latitude and a smaller loss of the tone value over the whole tone scale but especially in the lower range of said scale in function of the number of printed copies when the frequency modulated halftone dot with the greatest main dimension on said lithographic printing plate has a main dimension of more than 21 µm.

A "micro dot" or "elementary dot" or "recorder element" is the smallest addressable unit on a digital recorder. Its size is referred to as the recorder "pitch" (P). In connection with photographic materials which were subjected to a process comprising a frequency modulation screening of the original a frequency modulated halftone dot is the smallest image unit that is rendered on said photographic material after exposing and processing said material.

The main dimension of a frequency modulated halftone dot according to the invention is the side when said dot is a square: the length when said dot is a rectangle: the diameter when said dot is a circle; the longest axis when said dot is an ellipse and the square root of the surface area when said dot has another form.

The main dimension of a frequency modulated halftone dot with the greatest main dimension on said printing plate according to the invention is more than 21 µm, preferably more than 25 µm. The main dimension of a frequency modulated halftone dot with the greatest main dimension on said printing plate according to the invention is dependent on the application wherein said printing plate is used but is preferably not more than 100 µm.

Preferably the main dimension of at least 75% of the frequency modulated halftone dots, more preferably of at least 90% of the frequency modulated halftone dots, still more preferably of substantially all of the frequency modulated halftone dots on said printing plate is more than 21 µm. Still more preferably the main dimension of at least 75% of the frequency modulated halftone dots, even more preferably of at least 90% of the frequency modulated halftone dots, particularly preferably of substantially all of the frequency modulated halftone dots on said printing plate is more than 25 µm.

In the case of the present invention the dimension of a frequency modulated halftone dot can be most easily measured in the areas of low density on the black frequency modulated halftone dots and in the areas of high density on the shining frequency modulated halftone dots A frequency modulated halftone dot with the greatest main dimension according to the invention can consist of one microdot and is then obtained by an optical and/or mechanical manipulation of the recording beam of the digital image recorder. Preferably said halftone dot consist of a m * n matrix of "micro dots" wherein m represents 2 or a greater integer and n represents 1 or a greater integer and m * P and/or n * P>21 µm. Although m and n can have different values they are preferably equal, yielding a halftone dot that is essentially a square.

The original containing continuous tones is screened by frequency modulation screening. Frequency modulation screening is a technique in which the continuously changing tone values of an original are reproduced by means of equally sized micro dots, the number of which is proportional to the tone value of the original image. The name frequency modulation refers to the fact that the number of micro dots per unit surface (the frequency) fluctuates in proportion to the tone value in that same area.

Various dot frequency modulation screening techniques suitable for use in connection with the present invention have been disclosed and they can be divided into the following subclasses:

1) Point to Point thresholding based techniques,
2) Error Diffusion along a line by line, column by column scan (and variations).
3) Error Propagation along a Hilbert scan (and variations).
4) Special techniques.

A special technique is disclosed in DE 2,931,092, and further developed in U.S. Pat. No. 4,485,397.

The most representative technique of point to point thresholding is the halftoning based on the "Bayer" dither matrix as described by Bayer, B. E., "An optimum method for two level rendition of continuous-tone pictures", Proc. IEEE International Conference on Communications, Conference Record, pp. (26–11), (26–15)., 1973. This Bayer dither matrix has a size that is a power of two, and contains threshold values that are arranged in such a fashion that, when thresholded against increasing levels of density, every halftone dot is "as far away as possible" from the halftone dots that are used to render the lower density levels.

A number of variations on this technique are developed. A method is disclosed in EP-A 639023 wherein said frequency modulation screening of an original comprises the steps of : (i) generating a non-halftone value: (ii) altering said non-halftone value at a higher tone resolution than the tone resolution of said original and (iii) utilizing said altered non-halftone value to produce a halftone value for the frequency modulated halftone screening.

Another method is disclosed in EP-A 94202329.2 wherein said frequency modulation screening of an original originates a halftone screen having a plurality of halftone dots, at least some of which have a size greater than the size of a pixel of said contone original and at least some of which have a size equal to the size of a pixel of said contone original. Said methods may be used alone or in combination.

Another Point to Point thresholding technique uses a "Blue Noise Mask" instead of a Bayer dither matrix. It is described in U.S. Pat. No. 5,111,310. The Blue Noise Mask is the result of an optimization (filtering) performed iteratively (for the subsequent threshold "layers") on the Fourier transform of the threshold matrix.

Another frequency modulation screening techniques suitable for use in connection with the present invention is the well known Error diffusion first described by Floyd and Steinberg "An adaptive algorithm for spatial grey scale" SID 75 Digest. Society for information display 1975, pp. 36–37. According to the error diffusion technique the image pixels of a continuous tone image are processed one after the other according to a predetermined path e.g. from left to right and top to bottom.

The tone value of each image pixel is thereby compared with a threshold value which is generally the tone value half-way the tone scale e.g. 128 when the tones of the image-pixels range from 0 to 256. Depending on whether the tone value of the image pixel is above or below the threshold value a halftone dot will be set or not in the corresponding reproduction of the image pixel. The resulting error or weighted error, i.e. the difference between the reproduction value and actual value of the image pixel, is then added to the tone value of one or more neighbouring image pixels that are still unprocessed. Details about the error diffusion screening method may be found in the aforementioned reference or in U.S. Pat. No. 5,175,804.

A more preferred variant of frequency modulation screening for use in connection with the present invention is a method similar to the error diffusion with the exception that the order in which the image pixels are processed can be described by a space filling deterministic fractal curve or a randomized space filling curve.

This type of frequency modulation screening comprises the following steps:

selecting an unprocessed image pixel from the original continuous tone image according to a space filling deterministic fractal curve or a randomized space filling curve and processing said unprocessed image pixel as follows:

determining from the tone value of said unprocessed image pixel a reproduction value to be used for recording said image pixel on a recording medium e.g. a photographic film or lithographic printing plate precursor.

calculating an error value on the basis of the difference between said tone value of said unprocessed image pixel and said reproduction value, said unprocessed image pixel thereby becoming a processed image pixel, adding said error value to the tone value of an unprocessed image pixel and replacing said tone value with the resulting sum or alternatively distributing said error value over two or more unprocessed image pixels by replacing the tone value of each of said unprocessed image pixels to which said error value will be distributed by the sum of the tone value of the unprocessed image pixel and part of said error, repeating the above steps until all image pixels are processed.

A suitable deterministic fractal curve is for example the so called "Hilbert Curve" disclosed by Witten Ian H., and Radford M. Neal, "Using Peano Curves for Bilevel Display of Continuous-Tone Images", IEEE CG&A, May 1982, pp. 47–52.

According to a particularly preferred embodiment in connection with the present invention the order of processing the image pixels is ruled by a randomized space filling curve. With the term "randomized space filling curve" is meant that the processing of the image pixels follows basically a pre-determined curve that assures that each image pixel will be processed but which curve is randomized at a number of points so that patterns are avoided.

According to an alternative a randomized space filling curve may be obtained by dividing the image into matrices of image pixels. Within each of these matrices the image pixels are processed at random until all image pixels are processed. The order in which the matrices are processed may then be selected at random or in a predetermined way.

The most preferred alternative over the above method of dividing the image into matrices is the recursively division of the image into smaller matrices until the size of a matrix reaches an image pixel. At every subdivision into smaller submatrices a random ordering of processing the matrices is assigned to every submatrix. More details on these screening techniques are disclosed in e.g. EP-A 571.010 and EP-A 93201114.1, which therefor are hereby incorporated by reference.

The figure shows a circuit to perform a frequency modulation screening in combination with a binary recording device, e.g. an image-setter. First the different building blocks of this circuit are described, later on its operation will be explained.

Block (20) is a memory block containing the contone pixel values of an image. Typically these are 8 bit values, organized as N lines with M columns. Block (30) is a memory block with the same lay out as block (20), in which the halftoned pixel values will be stored. In the case of a binary recording device, every halftoned pixel word has a length of 1 bit. Block (80) is a device capable of image-wise exposing a substrate e.g. a photographic film or a lithographic printing plate precursor using the information in block (30). Block (70) is an arithmetic unit capable of calculating the sum of the pixelvalue P(i,j) and the error E at the output of a delay register (60). The conversion of a contone pixel value into a halftoned pixel value takes place in block (40). This conversion may be based on a thresholding operation: if the contone value at point (i.j) is below the value of 128, a value "0" is stored in the halftone memory, otherwise a "1" is stored. Block (50) contains an arithmetic unit that is capable to calculate the error between the original contone value, and the halftoned pixel value, and to store it in the delay register (60). Block (8) is a counter that sequences the processing of the N*M pixels of the image. Block (10) is LUT with N*M entries (one for every image pixel), and a UNIQUE combination of a row and column address that corresponds with one pixel position in the image. Block (5) is a clock.

The table of block (10) thus holds the order in which the image pixels will be processed. This table may be calculated according to one of the methods described above.

The operation of the diagram is now explained. At every clock pulse, the counter (8) is incremented, and a new pair of coordinates (i(n),j (n)) is obtained from block (10). These coordinates are used as address values to the pixel memory (20), to obtain a contone pixel value P(i(n),j(n)). This pixel value is immediately added to the error E(i(n−1),j(n−1)), that was stored in register (60) after the previous halftone step, and the sum of both is compared to the threshold value (41) in block (40). The outcome of the thresholding operation determines the value H(i(n),j(n)) that will be written into the halftone pixel memory at position (i(n),j(n)). At the same time a new error E(i(n),j(n)) is calculated from the difference between P(i(n),j (n)) and H(i(n),j(n)) and stored in the delay register (60). The circuit is initialized by setting the counter (8) to 1, the error to 128, and the operation is terminated when the counter reaches the level N*M. After that, the halftone memory (30) is read out line by line, column by column, and its contents are recorded on a substrate by the recorder (80).

According to a variant of the above circuit the error that is obtained from the difference between the contone pixel and the halftoned pixel value, may, instead of being diffused only to the next pixel in the order of processing, diffused to more than one of the unprocessed pixels. Instead of using the error of one pixel, one may also use an average error of a number of pixels.

In case of a color image, the above described screening process is performed on each of the color separations of the image.

Preferably the color image is separated in its Yellow, Magenta, Cyan and Black components. Each of these components may then be screened and used to image-wise expose four lithographic printing plate precursors according to the present invention. Four lithographic printing plates, one for each color separation, will thus be obtained. The color separations can then be printed over each other in register in a lithographic printing machine using the four plates.

According to a preferred embodiment of the present invention the CMYK color separations are prepared starting from a device independent representation of the color image. More details on this technique are disclosed in e.g. WO 94/06242, which therefor is incorporated hereby for reference.

Image-wise exposure in accordance with the present invention may proceed by a scan-wise exposure by means of e.g. a laser or LED directly according to said screened data on the printing plate precursor (so called computer to plate) or it may be performed by first exposing according to said screened data an intermediate photographic film of high contrast, generally a high contrast silver halide film, and then using the imaged photographic film as a mask for exposing a lithographic printing plate precursor to a conventional light source in a camera exposure or contact exposure.

Suitable devices for said scan-wise exposure are e.g. Cathode Ray Tubes, LED's or, most preferably lasers.

Examples of lasers that can be used in connection with the present invention are e.g. He/Ne lasers, Argon ion lasers, semiconductor lasers, YAG lasers e.g. Nd-YAG lasers etc..

Photographic films and printing plate precursors having a flexible support are preferably exposed using a drum scanner. Examples of such exposure units containing a HeNe laser are the image-setters LINOTRONIC 300, marketed by LINOTYPE-HELL Co, and Select 5000/7000, marketed by Miles Inc. Such an image-setter provided with an Ar ion laser that can be used is LS 210, marketed by Dr-Ing RUDOLF HELL GmbH. Such exposure units provided with a laserdiode that can be used are LINOTRONIC 200, marketed by LINOTYPE-HELL Co, and ACCUSET marketed by Miles Inc.

Because of the stiffness of an aluminium support this type of imaging elements used to be exposed using a flat-bed scanner but recently also appropriate drum scanners are used.

A lithographic printing plate precursor suitable for use in the present invention comprises in the order given on a hydrophilic surface of a support a layer of physical development nuclei and a silver halide emulsion layer in water permeable contact with said image receiving layer.

Layers being in waterpermeable contact with each other are layers that are contiguous to each other or only separated from each other by (a) waterpermeable layer(s). The nature of a waterpermeable layer is such that it does not substantially inhibit or restrain the diffusion of water or of compounds contained in an aqueous solution e.g. developing agents or the complexed silver.

The imaging element is preferably prepared by coating the different layers on a hydrophilic surface of a support. Alternatively the different layers may be laminated to said image receiving layer from a temporary base holding the layers in reverse order as disclosed in U.S. Pat. No. 5,068,165.

Said hydrophilic surface of a support can be a hardened hydrophilic layer, containing a hydrophilic binder and a hardening agent coated on a flexible support.

Such hydrophilic binders are disclosed in e.g. EP-A 450,199, which therefor is incorporated herein by reference. Preferred hardened hydrophilic layers comprise partially modified dextrans or pullulan hardened with an aldehyde as disclosed in e.g. EP-A 514,990 which therefor is incorporated herein by reference. More preferred hydrophilic layers are layers of polyvinyl alcohol hardened with a tetraalkyl orthosilicate and preferably containing $SiO_2$ and/or $TiO_2$ wherein the weight ratio between said polyvinylalcohol and said tetraalkyl orthosilicate is between 0.5 and 5 as disclosed in e.g. GB-P 1,419,512, FR-P 2,300,354, U.S. Pat. No. 3,971,660. U.S. Pat. No. 4.28,705, EP-A 405,016 and EP-A 450,199 which therefor are incorporated herein by reference.

Flexible supports may be opaque or transparent, e.g. a paper support or resin support. When a paper support is used preference is given to one coated at one or both sides with an Alpha-olefin polymer. It is also possible to use an organic resin support e.g. poly(ethylene terephthalate) film or poly-Alpha-olefin films. The thickness of such organic resin film is preferably comprised between 0.07 and 0.35 mm. These organic resin supports are preferably coated with a hydrophilic adhesion layer which can contain water insoluble particles such as silica or titanium dioxide. Metal supports e.g. aluminum may also be used.

Said hydrophilic surface of a support is preferably a hydrophilic metallic support e.g. an aluminium foil.

The aluminum support of the imaging element for use in accordance with the present invention can be made of pure aluminum or of an aluminum alloy, the aluminum content of which is at least 95%. The thickness of the support usually ranges from about 0.13 to about 0.50 mm.

The preparation of aluminum or aluminum alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results. Preferably the aluminum foil has a roughness with a CLA value between 0.2 and 1.5 µm, an anodization layer with a thickness between 0.4 and 2.0 µm and is sealed with an aqueous bicarbonate solution.

According to the present invention The roughening of the aluminum foil can be performed according to the methods well known in the prior art. The surface of the aluminum substrate can be toughened either by mechanical, chemical or electrochemical graining or by a combination of these to obtain a satisfactory adhesiveness of a silver halide emulsion layer to the aluminum support and to provide a good water retention property to the areas that will form the non-printing areas on the plate surface.

The electrochemical graining process is preferred because it can form a uniform surface roughness having a large average surface area with a very fine and even grain which is commonly desired when used for lithographic printing plates.

Electrochemical graining can be conducted in a hydrochloric and/or nitric acid containing electrolyte solution using an alternating or direct current. Other aqueous solutions that can be used in the electrochemical graining are e.g. acids like HCl, $HNO_3$, $H_2SO_2$, $H_3PO_4$, that if desired, contain additionally one or more corrosion inhibitors such as Al $(NO_3)_3$, $AlCl_3$, boric acid, chromic acid, sulfates, chlorides, nitrates, monoamines, diamines, aldehydes, phosphates, $H_2O_2$, etc. . . .

Electrochemical graining in connection with the present invention can be performed using single-phase and three-phase alternating current. The voltage applied to the aluminum plate is preferably 10–35 V. A current density of 3–150 Amp/dm$^2$ is employed for 5–240 seconds. The temperature of the electrolytic graining solution may vary from 5°–50° C. Electrochemical graining is carried out preferably with an alternating current from 10 Hz to 300 Hz.

The toughening is preferably preceded by a degreasing treatment mainly for removing greasy substances from the surface of the aluminum foil.

Therefore the aluminum foil may be subjected to a degreasing treatment with a surfactant and/or an aqueous alkaline solution.

Preferably roughening is followed by a chemical etching step using an aqueous solution containing an acid. The chemical etching is preferably carried out at a temperature of at least 30° C. more preferably at least 40° C. and most preferably at least 50° C.

Suitable acids for use in the aqueous etch solution are preferably inorganic acids and most preferably strong acids. The total amount of acid in the aqueous etch solution is preferably at least 150 g/l. The duration of chemical etching is preferably between 3 s and 5 min.

After toughening and optional chemical etching the aluminum foil is anodized which may be carried out as follows.

An electric current is passed through the grained aluminum foil immersed as an anode in a solution containing sulfuric acid, phosphoric acid, oxalic acid, chromic acid or organic acids such as sulfamic, benzosulfonic acid, etc. or mixtures thereof. An electrolyte concentration from 1 to 70% by weight can be used within a temperature range from 0°–70° C. The anodic current density may vary from 1–50 A/dm$^2$ and a voltage within the range 1–100 V to obtain an anodized film weight of 1–8 g/m$^2$ $Al_2O_3.H_2O$. The anodized aluminum foil may subsequently be rinsed with demineralised water within a temperature range of 10°–80° C.

After the anodizing step sealing may be applied to the anodic surface. Sealing of the pores of the aluminum oxide layer formed by anodization is a technique known to those skilled in the art of aluminum anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminum". Different types of sealing of the porous anodized aluminum surface exist.

Preferably, said sealing is performed by treating a grained and anodized aluminum support with an aqueous solution containing a bicarbonate as disclosed in EP-A 567178, which therefor is incorporated herein by reference.

Preferably each of the above described steps is separated by a rinsing step to avoid contamination of the liquid used in a particular step with that of the preceding step.

To promote the image sharpness and, as a consequence thereof, the sharpness of the final printed copy, the anodization layer may be coloured in the mass with an antihalation dye or pigment e.g. as described in JA-Pu-58-14,797.

Subsequent to the preparation of the hydrophilic layer of a support as described above, said hydrophilic layer may be immediately coated with a solution containing the physical development nuclei or may be coated with said solution at a later stage.

The image receiving layer containing physical development nuclei is preferably free of hydrophilic binder but may comprise small amounts e.g. upto 80% by weight of the total weight of said layer of a hydrophilic colloid e.g. polyvinyl alcohol to improve the hydrophilicity of the surface.

Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The photosensitive layer used according to the present invention may be any layer comprising a hydrophilic colloid binder and at least one silver halide emulsion, at least one of the silver halide emulsions being photosensitive.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

For use according to the present invention the silver halide emulsion or emulsions preferably consist principally of silver chloride while a fraction of silver bromide may be present ranging from 1 mole % to 40 mole %. Most preferably a silver halide emulsion containing at least 70 mole % of silver chloride is used.

The average size of the silver halide grains may range from 0.10 to 0.70 µm, preferably from 0.25 to 0.45 µm.

Preferably during the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. KOSLOWSKY, Z. Wiss. Photogr. Photophys. Photochem. 46, 65–72 (1951).

Apart from negative-working silver halide emulsions that are preferred for their high photosensitivity, use can be made also of direct-positive silver halide emulsions that produce a positive silver image in the emulsion layer(s) and a negative image on the image-receiving layer.

Suitable direct positive silver halide emulsions for use in accordance with the present invention are silver halide emulsions that have been previously fogged or that mainly form an internal latent image.

Internal latent image-type silver halide emulsions that can be used in accordance with the present invention have been described in e.g. U.S. Pat. Nos. 2,592,250, 3,206,313, 3,271, 157, 3,447,927, 3,511,662, 3,737,313, 3,761,276, GB-A 1,027,146, and JA Patent Publication No. 34,213/77. However, the silver halide emulsions used in the present invention are not limited to the silver halide emulsions described in these documents.

The other type of direct positive type silver halide emulsions for use in accordance with the present invention, which is of the previously fogged type, may be prepared by overall exposing a silver halide emulsion to light and/or by chemically fogging a silver halide emulsion. Chemical fog specks may be formed by various methods for chemical sensitization.

Chemical fogging may be carried out by reduction or by a compound which is more electropositive than silver e.g. gold salts, platinum salts, iridium salts etc., or a combination of both. Reduction fogging of the silver halide grains may occur by high pH and/or low pAg silver halide precipitation or digestion conditions e.g. as described by Wood J. Phot. Sci. 1 (1953), 163 or by treatment with reducing agents e.g. tin(II) salts which include tin(II)chloride, tin complexes and tin chelates of (poly)amino(poly)carboxilic acid type as described in British Patent 1,209,050, formaldehyde, hydrazine, hydroxylamine, sulphur compounds e.g. thiourea dioxide, phosphonium salts e.g. tetra(hydroxymethyl)phosphonium chloride, polyamines e.g. diethylenetriamine, bis(p-aminoethyl)sulphide and its water-soluble salts, hydrazine derivatives, alkali arsenite, amine borane etc. or mixtures thereof.

When fogging of the silver halide grains occurs by means of a reducing agent e.g. thiourea dioxide and a compound of a metal more electropositive than silver especially a gold compound, the reducing agent is preferably used initially and the gold compound subsequently. However, the reverse order can be used or both compounds can be used simultaneously.

In addition to the above described methods of chemically fogging chemical fogging can be attained by using said fogging agents in combination with a sulphur-containing sensitizer, e.g. sodium thiosulphate or a thiocyanic acid compound e.g. potassium thiocyanate.

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensitizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. Nos. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

The silver halide emulsion layers usually contains gelatin as hydrophilic colloid binder. Mixtures of different gelatins with different viscosities can be used to adjust the rheological properties of the layer. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

Preferably the gelatin layer(s) is(are) substantially unhardened. Substantially unhardened means that when such gelatin layer is coated on a subbed polyethylene terephtalate film base at a dry thickness of 1.2 $g/m^2$, dried for 3 days at 57° C. and 35% R.H. and dipped in water of 30° C., said gelatin layer is dissolved for more than 95% by weight within 5 minutes.

The silver halide emulsions may contain pH controlling ingredients. Preferably at least one gelatin containing layer is coated at a pH value not below the iso-electric point of the gelatin to avoid interactions between said gelatin containing coated layer and the hereafter mentioned optional intermediate layer. More preferably the gelatin layer contiguous to said intermediate layer is coated at a pH value not below the iso-electric point of the gelatin. Most preferably all the gelatin containing layers are coated at a pH value not below the iso-electric point of their gelatin. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787 and DE-P 2.453,217.

More details about the composition, preparation and coating of silver halide emulsions suitable for use in accordance with the present invention can be found in e.g. Product Licensing index, Vol. 92, Dec. 1971, publication 9232, p. 107–109.

Preferably, the imaging element also comprises an intermediate layer between the image receiving layer on the hydrophilic surface of a support and the photosensitive layer(packet) to facilitate the removal of said layer(packet) thereby uncovering the silver image formed in the image receiving layer by processing the imaging element.

In one embodiment, the intermediate layer is a water-swellable intermediate layer coated at a ratio of 0.01 to 2.0 g/m$^2$ and comprising at least one non-proteinic hydrophilic film-forming polymer e.g. polyvinyl alcohol and optionally comprising an antihalation dye or pigment as disclosed in EP-A-410500.

In another embodiment, the intermediate layer is a layer comprising hydrophobic polymer beads having an average diameter not lower than 0.2 μm and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A-483415.

A supplemental intermediate layer, which may be present between said silver halide emulsion containing layer and said water-swellable intermediate layer or said intermediate layer comprising hydrophobic polymer beads may incorporate one or more ingredients such as i.a. antihalation dyes or pigment, developing agents, silver halide solvents, base precursors, and anticorrosion substances.

When the imaging element is prepared by laminating a layer packet comprising a photosensitive layer onto the image receiving layer the intermediate layer(s) are provided on the photosensitive layer(s), the water-swellable intermediate layer or the intermediate layer comprising hydrophobic polymer beads having an average diameter not lower than 0.2 μm and having been prepared by polymerization of at least one ethylenically unsaturated monomer being the upper layer.

To obtain a lithographic printing plate according to the invention an above described precursor of the mono-sheet DTR offset printing plate of the second type is information-wise exposed as described above in accordance with the present invention. According to the present invention the development and diffusion transfer of the information-wise exposed imaging element in order to form a silver image in said photosensitive layer and to allow unreduced silver halide or complexes formed thereof to diffuse image-wise from the photosensitive layer to said image receiving layer to produce therein a silver image, are effected with the aid of an aqueous alkaline solution in the presence of (a) developing agent(s), and (a) silver halide solvent(s). The developing agent(s) and/or the silver halide solvent(s) can be incorporated in the aqueous alkaline solution and/or in the imaging element.

Preferably a silver halide solvent in the aqueous alkaline solution is used in an amount between 0.05% by weight and 5% by weight and more preferably between 0.5% by weight and 2% by weight. The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate.

Further silver halide solvents that can be used in connection with the present invention are e.g. sulphite, amines, 2-mercaptobenzoic acid, cyclic imide compounds such as e.g. uracil, 5,5-dialkylhydantoins, alkyl sulfones and oxazolidones.

Further silver halide solvents for use in connection with the present invention are alkanolamines. Examples of alkanolamines that may be used in connection with the present invention correspond to the following formula:

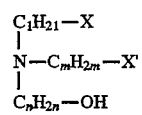

wherein X and X' independently represent hydrogen, a hydroxyl group or an amino group, 1 and m represent 0 or integers of 1 or more and n represents an integer of 1 or more. Said alkanolamines may be present in the alkaline processing liquid in a concentration preferably between 0.1% and 5% by weight. However part or all of the alkanolamine can be present in one or more layers of the imaging element.

Still other preferred further silver halide solvents for use in connection with the present invention are thioethers. Preferably used thioethers correspond to the following general formula:

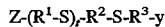

wherein Z and Y each independently represents hydrogen, an alkyl group, an amino group, an ammonium group, a hydroxyl, a sulfo group, a carboxyl, an aminocarbonyl or an aminosulfonyl, $R^1$, $R^2$ and $R^3$ each independently represents an alkylene that may be substituted and optionally contain a oxygen bridge and t represents an integer from 0 to 10. Examples of thioether compounds corresponding to the above formula are disclosed in e.g. U.S. Pat. No. 4.960.683 and EP-A 554,585.

Still further suitable silver halide solvents are 1,2,4-triazolium-3-thiolates, preferably 1,2,4-triazolium-3-thiolates substituted with at least one substituent selected from the group consisting of a $C_1$–$C_8$ alkyl group that contains at least 3 fluorine atoms, a $C_4$–$C_{10}$ hydrocarbon group and a 4-amino group substituted with a $C_1$–$C_8$ alkyl group that contains at least 3 fluorine atoms and/or a $C_4$–$C_{10}$ hydrocarbon group.

Combinations of different silver halide solvents can be used and it is also possible to incorporate at least one silver halide solvent into a suitable layer of the imaging element and to add at least one other silver halide solvent to the developing solution.

The alkaline processing liquid may also contain (a) developing agent(s). In this case the alkaline processing liquid is called a developer. On the other hand some or all of the developing agent(s) may be present in one or more layers of the photographic material or imaging element. When all of the developing agents are contained in the imaging element the alkaline processing liquid is called an activator or activating liquid.

Silver halide developing agents for use in accordance with the present invention are preferably of the p-dihydroxybenzene type, e.g. hydroquinone, methylhydroquinone or chlorohydroquinone, preferably in combination with an auxiliary developing agent being a 1-phenyl-3-pyrazolidone-type developing agent and/or p-monomethylaminophenol. Particularly useful auxiliary developing agents are the 1-phenyl-3-pyrazolidones. Even more preferred, particularly when they are incorporated into the photographic material are 1-phenyl-3-pyrazolidones of which the aqueous solubility is increased by a hydrophilic substituent such as e.g. hydroxy, amino, carboxylic acid group, sulphonic acid group etc.. Examples of 1-phenyl-3-pyrazolidones substituted with one or more hydrophilic groups are e.g. 1-phenyl-4,4-dimethyl-2-hydroxy-3-pyrazolidone, 1-(4-carboxyphenyl)-4,4-dimethyl-3-pyrazolidone etc.. However other developing agents can be used.

Preferred amounts of the hydroquinone-type developing agents are in the range of 0.05 mole to 0.40 mole per liter and preferred amounts of secondary developing agent(s) in the range of $1.8\times 10^{-3}$ to $2.0\times 10^{-1}$ mole per liter.

The aqueous alkaline solution in accordance with the present invention may further comprise sulphite e.g. sodium sulphite in an amount ranging from 40 g to 180 g per liter, preferably from 60 to 160 g per liter in combination with another silver halide solvent.

The quantitative ranges given for the developing agents, silver halide solvents, and sulphite apply to the amount of these compounds present as solutes in the aqueous alkaline solution during the DTR-processing, whether these compounds make part of the aqueous alkaline solution or were dissolved from the layers containing them upon application thereto of the aqueous alkaline solution.

The aqueous alkaline solution suitable for use according to the present invention preferably comprises aluminum ions in an amount of at least 0.3 g/l, more preferably in an amount of at least 0.6 g/l in order to prevent sticking of the emulsion layer to the transporting rollers when the emulsion is swollen with the aqueous alkaline solution.

The alkaline processing liquid preferably has a pH between 9 and 14 and more preferably between 10 and 13, but depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The pH of the alkaline processing liquid may be established by an organic or inorganic alkaline substance or a combination thereof. Suitable inorganic alkaline substances are e.g. hydroxides of sodium and potassium, alkali metal salts of phosphoric acid and/or silicic acid e.g. trisodium phosphate, orthosilicates, metasilicates, hydrodisilicates of sodium or potassium, and sodium carbonate etc.. Suitable organic alkaline substances are e.g. alkanolamines. In the latter case the alkanolamines will provide or help providing the pH and serve as a silver halide complexing agent.

The aqueous alkaline solution may further comprise hydrophobizing agents for improving the hydrophobicity of the silver image obtained in the image receiving layer. Generally these compounds contain a mercapto group or thiolate group and one or more hydrophobic substituents. Particularly preferred hydrophobizing agents are mercapto-1,3,4-thiadiazoles as described in DE-A 1,228,927 and in U.S. Pat. No. 4,563,410, 2-mercapto-5-heptyl-oxa-3,4-diazole and long chain (at least 5 carbon atoms) alkyl substituted mercaptotetrazoles. The hydrophobizing agents can be used alone or in combination with each other.

These hydrophobizing compounds can be added to the aqueous alkaline solution in an amount of preferably 0.1 to 3 g per liter and preferably in admixture with 1-phenyl-5-mercaptotetrazole, the latter compound may be used in amounts of e.g. 50 mg to 1.2 g per liter of solution, which may contain a minor amount of ethanol to improve the dissolution of said compounds.

The aqueous alkaline solution may comprise other ingredients such as e.g. oxidation preservatives, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range from 5 to 7.

Buffered stop bath compositions comprising a mixture of sodium dihydrogen orthophosphate and disodium hydrogen orthophosphate and having a pH in said range are preferred.

The development and diffusion transfer can be initiated in different ways e.g. by rubbing with a roller, by wiping with an absorbent means e.g. with a plug of cotton or sponge, or by dipping the material to be treated in the liquid composition. Preferably, they proceed in an automatically operated apparatus. They are normally carried out at a temperature in the range of 18° C. to 30° C. and in a time from 5 s to 5 min.

After formation of the silver image on the hydrophilic surface of a support an excess of aqueous alkaline solution still present on the base may be eliminated, preferably by guiding the foil through a pair of squeezing rollers.

The silver image thus obtained in the layer of physical development nuclei is subsequently uncovered by treating the imaging element to remove all the layers above the layer containing physical development nuclei, thereby exposing the imaged surface of the hydrophilic support.

According to a particularly preferred embodiment of the present invention the silver image in the layer of physical development nuclei is uncovered by washing off all the layers above the layer containing physical development nuclei with rinsing water.

The temperature of the rinsing water may be varied widely but is preferably between 30° C. and 50° C., more preferably between 35° C. and 45° C.

The imaged surface of the hydrophilic surface of a support can be subjected to a chemical treatment that increases the hydrophilicity of the non-silver image parts and the oleophilicity of the silver image This chemical after-treatment is preferably carried out with a lithographic composition often called finisher comprising at least one compound enhancing the ink-receptivity and/or lacquer-receptivity of the silver image and at least one compound that improves the ink-repelling characteristics of the hydrophilic surface.

Suitable ingredients for the finisher are e.g. organic compounds containing a mercapto group such as the hydrophobizing compounds referred to hereinbefore for the alkaline solution. Preferred compounds correspond to one of the following formulas:

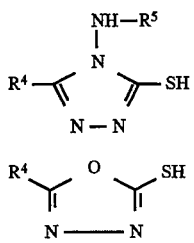

wherein $R^5$ represents hydrogen or an acyl group. $R^4$ represents alkyl, aryl or aralkyl. Most preferably used compounds are compounds according to one of the above formulas wherein $R^4$ represents an alkyl containing 3 to 16 C-atoms. Said (a) hydrophobizing agent(s) is(are) comprised in the finisher preferably in a total concentration between 0.1 g/l and 10 g/l more preferably in a total concentration between 0.3 g/l and 3 g/l.

Additives improving the oleophilic ink-repellency of the hydrophilic surface areas are e.g. carbohydrates such as acidic polysaccharides like gum arabic, carboxymethylcellulose, sodium alginate, propylene glycol ester of alginic acid, hydroxyethyl starch, dextrin, hydroxyethylcellulose, polyvinyl pyrrolidone, polystyrene sulphonic acid, polyglycols being the reaction products of ethyleneoxide and/or propyleneoxide with water or an alcohol and polyvinyl alcohol. Optionally, hygroscopic substances e.g. sorbitol, glycerol, tri(hydroxyethyl)ester of glycerol, and turkey red oil may be added.

Furthermore (a) surface-active compound(s) is preferably also added to the finisher. The concentration thereof may vary within broad ranges provided the finisher shows no excessive degree of foaming when plates are finished. Preferred surface-active compound are anionic or non-ionic surface-active compound.

A suitable finisher as disclosed in U.S. Pat. No. 4,563,410 is a composition comprising a solution of a mercaptotriazole in a solution of polyethylene oxide with a molecular weight of 4,000. Further suitable finishers have been described in i.a. U.S. Pat. No. 4.062,682.

At the moment the treatment with the finisher is started the surface carrying the silver pattern may be in dry or wet state. In general, the treatment with the finisher does not take long, usually not longer than about 30 seconds and it may be carried out immediately after the processing and uncovering steps, preferably at a temperature of the finisher in the range from 30° C. to 60° C.

The finisher can be applied in different ways such as by rubbing with a roller, by wiping with an absorbent means e.g. with a plug of cotton or sponge, or by dipping the material to be treated in the finisher. The image-hydrophobizing step of the printing plate may also proceed automatically by conducting the printing plate through a device having a narrow channel filled with the finisher and conveying the printing plate at the end of the channel between two squeezing rollers removing the excess of liquid.

As soon as the hydrophilic surface of a support carrying the silver image has been treated with the finisher, it is ready to be used as a printing plate.

The following example illustrates the present invention without however, limiting it thereto. All parts, percentages and ratios are by weight unless otherwise indicated.

EXAMPLE 1

(Comparative Example)

Preparation of the lithographic plate precursor.

A 0.30 mm thick aluminium foil (AA 1050) was degreased by immersing the foil in an aqueous solution containing 10% phosphoric acid and subsequently etched in an aqueous solution containing 2 g/l of sodium hydroxide. The foil was then electrochemically grained using an alternating current in an aqueous solution containing 4 g/l of hydrochloric acid and 4 g/l of hydroboric acid at a temperature of 35° C. to form a surface topography with an average center-line roughness Ra of 0,6 µm. The aluminium plate was then desmutted with an aqueous solution containing 30% of sulfuric acid at 60° C. for 120 seconds. The foil was subsequently subjected to anodic oxidation in a 20% sulfuric acid aqueous solution to form an anodic oxidation film of 3.0 g/m$^2$ of $Al_2O_3.H_2O$, treated with an aqueous solution containing 20 g/l of $NaHCO_3$ at 45° C. for 30 sec and then rinsed with demineralised water and dried.

The imaging element was obtained by coating the grained, anodized and sealed aluminium support with a silver-receptive stratum containing 1.1 mg/m$^2$ PdS as physical development nuclei.

An intermediate layer was then provided on the dry silver-receptive stratum from an aqueous composition in such a way that the resulting dried layer had a weight of 0.5 g of polymethyl methacrylate beads per m$^2$, said composition comprising:

| | |
|---|---|
| a 20 % dispersion of polymethyl methacrylate beads in a mixture of equal volumes of water and ethanol having an average diameter of 1.0 µm | 50 ml |
| Helioechtpapierrot BL (trade mark for a dye sold by BAYER AG, D-5090 Leverkusen, West-Germany) | 2.5 g |
| saponine | 2.5 g |
| sodium oleylmethyltauride | 1.25 g |
| demineralized water | 300 ml |

(pH-value : 5.6)

Finally a substantially unhardened photosensitive negative-working cadmium-free gelatin silver chlorobromoiodide emulsion layer (97.98/2/0.02 mol %) containing 1 mmole/mole AgX of 4-hydroxy-6-methyl-1,3,3a,7-tetraazaindene was coated on the intermediate layer, the silver halide being provided in an amount corresponding to 2.40 g of silver nitrate per m$^2$ and the gelatin content of the emulsion layer being 1.58 g/m$^2$, consisting of 0.7 g/m$^2$ of a gelatin with a viscosity of 21 mPa.s and the remainder of a gelatin with a viscosity of 14 mPa.s.

Preparation of the masks

An original was screened at 2400 dpi according to a frequency modulation screening wherein the image pixels were processed in a random order by recursively subdividing the image of the original into matrices until the size of a matrix matched the size of an image pixel. The error for each image pixel was added to the tone value of the next image pixel processed. A high contrast silver halide intermediate film was scan-wise exposed in accordance with the obtained screened data with an imaging beam having a "pitch" of 10.4 µm. The obtained microdots are arranged in a 2 * 2 matrix giving a frequency modulated halftone dot with a size of about 21 µm. Said exposed intermediate film was subjected to a classical processing and was then used as a mask 1. A mask 2 was prepared in an identical way as mask 1 with the exception that during the scan-wise exposure of said intermediate film the obtained microdots are arranged in a 3 * 3 matrix giving a frequency modulated halftone dot with a size of about 31 µm.

Preparation of the printing plates.

In order to obtain printing plate I a sample of the printing plate precursor was exposed through mask 1 to a Theimer light closet with a point light source in such a way that the 7 μm positive microlines of an UGRA test strip are reproduced on the plate. This is the criterium for the exposure of a printing plate as is explained in the manual "Agfa Cristal Raster User Guide. The exposed printing plate precursor is then immersed for 8 s at 24° C. in a freshly made developing solution having the following ingredients:

| | |
|---|---|
| carboxymethylcellulose | 4 g |
| sodium hydroxide | 22.5 g |
| anhydrous sodium sulphite | 120 g |
| hydroquinone | 20 g |
| 1-phenyl-3-pyrazolidinone | 6 g |
| potassium bromide | 0.75 g |
| anhydrous sodium thiosulphate | 8 g |
| ethylene diamine tetraacetic acid tetrasodium salt | 2 g |
| demineralized water to make | 1000 ml |
| pH (24° C.) = 13 | |

The initiated diffusion transfer was allowed to continue for 30 s to form a silver image in the image receiving layer.

To remove the developed silver halide emulsion layer and the intermediate layer from the aluminium foil the developed monosheet DTR material was rinsed for 10 s with a water jet at 30° C.

Next, the imaged surface of the aluminium foil was rubbed with a finisher to enhance the water-receptivity of the non-image areas and to make the image areas oleophilic ink-receptive. The finisher had the following composition:

| | |
|---|---|
| 10% aqueous n-hexadecyl trimethyl ammonium chloride | 25 ml |
| 20% aqueous solution of polystyrene sulphonic acid | 100 ml |
| potassium nitrate | 12.5 g |
| citric acid | 20.0 g |
| 1-phenyl-5-mercaptotetrazole | 2.0 g |
| sodium hydroxide | 5.5 g |
| water to make | 1000 ml |
| pH (20° C.) = 4 | |

A printing plate II was prepared in an identical way as printing plate I except that a sample of the lithographic printing plate precursor was exposed through mask 2.

A printing plate III was prepared in an identical way as printing plate I except that the exposed sample of the lithographic printing plate precursor was processed in an developing solution in normal working conditions (i.e. after developing 5 m² of the lithographic printing plate precursor).

A printing plate IV was prepared in an identical way as printing plate II except That the exposed sample of the lithographic printing plate precursor was processed in an developing solution in normal working conditions (i.e. after developing 5 m² of the lithographic printing plate precursor).

The size of the dots on the printing plates was measured. The dots on the printing plates I and III had a size of about 21 μm, while the dots on the printing plates II and IV had a size of about 31 μm.

The so obtained four plates were printed on a Heidelberg GTO 52 printing press equipped with a Dahlgren dampener. Hartmann S6920 ink was used and Rotamatic 100% was the fountain solution used. Prints were made on Zanders Ikonorex 115 g/m² paper at a speed of 5000 prints per hour. A density of 1.85 (FOGRA standard) on solid areas was maintained (Gretag D186). Densities were measured with a Macbeth RD918 densitometer according to the Murray-Davies formula.

After about 200 prints, when good quality prints were obtained, the following results were observed:

a) With printing plate I only from 7% to 95% of the tone scale of the mask could be reproduced on the printed copies, where with printing plate II from 2% to 98% of the tone scale of the mask could be reproduced on the printed copies.

b) At 40% of the tone value of the mask 1 the tone value deceased from 57% tone value for a copie printed from printing plate I to 45% for a copie printed from printing plate III (a loss of 12%), where at 40% of the tone value of the mask 2 the tone value deceased from 58% tone value for a copie printed from printing plate II to 56% for a copie printed from printing plate IV (a loss of 2%).

The tone value of copies from the printing plate I at 20% tone value of the mask I decreased from 35% tone value at the $100^{th}$ copie to 21% at the $10,000^{th}$ copie (a loss of 14%) where the tone value of copies from the printing plate II at a 20% tone value of the mask 2 decreased from 50% tone value at the $100^{th}$ copie to 45% at the $10,000^{th}$ copie (a loss of 5%).

So, it is clear from these results that the printing plate II obtained according to the DTR-process from a printing plate precursor comprising on a hydrophilic surface of a support in the order given a layer of physical development nuclei and a silver halide emulsion layer by means of frequency modulation screening an original to obtain screened data by means of frequency modulation and having frequency modulated dots with a size of 31 μm (printing plate according to the invention) has an extended tone range in print, a larger development latitude and a smaller loss of tone value over the whole tone scale but especially in the lower range of said tone scale in function of the number of printed copies compared with an identical printing plate I but having frequency modulated dots with a size of 21 μm (comparison printing plate).

I claim:

1. A method for making a lithographic printing plate according to the DTR-process from a printing plate precursor comprising on a hydrophilic surface of a support in the order given a layer of physical development nuclei and a silver halide emulsion layer from an original containing continuous tones comprising the steps of:

frequency modulation screening said original to obtain screened data, image-wise exposing said printing plate precursor according to said screened data, developing a thus obtained image-wise exposed lithographic printing plate precursor by means of an alkaline processing solution in the presence of a developing agent and a silver halide solvent yielding a lithographic printing plate with frequently modulated half tone dots wherein at least 75% of the frequency modulated halftone dot on said lithographic printing plate have a main dimension of more than 21 μm.

2. A method according to claim 1 wherein the frequency modulated halftone dot with the greatest main dimension on said lithographic printing plate has a main dimension of more than 25 μm.

3. A method according to claim 1 wherein the frequency modulated halftone dot with the greatest main dimension on said lithographic printing plate has a main dimension of not more than 100 μm.

4. A method according to claim 1 wherein said hydrophilic surface of a support is a grained and anodized aluminum foil.

5. A method according to claim 2 wherein the main dimension of at least 75% of the frequency modulated halftone dots is more than 25 μm.

6. A method according to claim 5 wherein the main dimension of at least 90% of the frequency modulated halftone dots is more than 25 µm.

7. A method according to claim 1 wherein said frequency modulated halftone dot with the greatest main dimension consist of one microdot.

8. A method according to claim 1 wherein said frequency modulated halftone dot with the greatest main dimension consist of a m*n matrix of "micro dots" wherein m represents an integer of at least 2 and n represents an integer of at least 1 and m*P and/or n*P>21 µm and P being the recorder "pitch".

9. A method according to claim 8 wherein said m and n represents the same integer.

10. A printing plate obtained by the method according to claim 1.

* * * * *